United States Patent
Kim et al.

(10) Patent No.: US 8,120,979 B2
(45) Date of Patent: Feb. 21, 2012

(54) SEMICONDUCTOR MEMORY DEVICES HAVING HIERARCHICAL BIT-LINE STRUCTURES

(75) Inventors: Jin-Young Kim, Seoul (KR); Ki-Whan Song, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 286 days.

(21) Appl. No.: 12/591,254

(22) Filed: Nov. 13, 2009

(65) Prior Publication Data
US 2010/0124135 A1      May 20, 2010

(30) Foreign Application Priority Data
Nov. 17, 2008    (KR) .................. 10-2008-0114216

(51) Int. Cl.
*G11C 7/00* (2006.01)

(52) U.S. Cl. .... 365/205; 365/203; 365/207; 365/230.03

(58) Field of Classification Search .................. 365/203, 365/205, 207, 233, 3, 51, 233.1
See application file for complete search history.

(56) References Cited

U.S. PATENT DOCUMENTS

| | | | |
|---|---|---|---|
| 5,822,248 A | 10/1998 | Kenichi et al. | |
| 5,917,744 A | 6/1999 | Kirihata et al. | |
| 6,768,692 B2 * | 7/2004 | Luk et al. | ............ 365/205 |
| 6,898,109 B2 | 5/2005 | Hirose et al. | |

FOREIGN PATENT DOCUMENTS

| | | |
|---|---|---|
| JP | 06-290591 | 10/1994 |
| KR | 10-1996-0019315 | 6/1996 |

* cited by examiner

*Primary Examiner* — David Lam
(74) *Attorney, Agent, or Firm* — Harness, Dickey & Pierce

(57) ABSTRACT

The semiconductor memory device includes a memory cell array and a switching circuit. The memory cell array includes a plurality of first memory cells connected between word lines and first local bit lines, and a plurality of second memory cells connected between the word lines and second local bit lines. The switching circuit is configured to respectively connect the first local bit lines to first global bit lines during a first sensing period, and to respectively connect the second local bit lines to second global bit lines during a second sensing period of a reading operation. The semiconductor memory device further includes a sensing circuit configured to sense and amplify data from the first global bit lines during the first sensing period, and to sense and amplify data from the second global bit lines during the second sensing period of the reading operation.

19 Claims, 6 Drawing Sheets

SEMICONDUCTOR MEMORY DEVICES HAVING HIERARCHICAL BIT-LINE STRUCTURES

CROSS-REFERENCE TO RELATED APPLICATION(S)

This application claims priority under 35 U.S.C. §119 to Korean Patent Application No. 10-2008-0114216, filed on Nov. 17, 2008, the entire contents of which are incorporated herein by reference.

BACKGROUND

1. Field

Example embodiments relate to semiconductor memory devices, and more particularly, to semiconductor memory devices having hierarchical bit-line structures.

2. Description of Related Art

Conventional semiconductor memory devices read data from their own memory cells and store data in the memory cells via bit lines connected to the memory cells. But, integration density of conventional semiconductor memory devices is gradually increasing. Accordingly, the number of memory cells per unit area and the number of memory cells connected by one or a pair of bit lines is also increasing. Such an increase in the number of memory cells connected to each bit line inevitably causes parasitic capacitance to increase and degrades an operating speed of the semiconductor memory device.

A hierarchical bit-line structure has been proposed to reduce parasitic capacitance of bit lines and reduce chip size even with increasing integration density. However, a conventional semiconductor memory device having a hierarchical bit-line structure suffers from noise caused by coupling capacitance between adjacent global bit lines.

SUMMARY

Example embodiments provide semiconductor memory devices having hierarchical bit-line structures capable of sensing and amplifying data of adjacent global bit lines in sequence.

At least one example embodiment provides a semiconductor memory device. According to at least this example embodiment, a memory cell array has a plurality of first memory cells connected between word lines and first local bit lines, and a plurality of second memory cells connected between the word lines and second local bit lines. A switching circuit is configured to respectively connect the first local bit lines to first global bit lines during a first sensing period of a reading operation, and to respectively connect the second local bit lines to second global bit lines during a second sensing period of the reading operation. A sensing circuit is configured to sense and amplify data from the first global bit lines during the first sensing period of the reading operation, and to sense and amplify data from the second global bit lines during the second sensing period of the reading operation.

According to at least some example embodiments, the sensing circuit maintains the second global bit lines at a constant or substantially constant voltage level during the first sensing period, and maintains the first global bit lines at a constant or substantially constant voltage level during the second sensing period. The sensing circuit includes: first and second sense amplifiers. The first sense amplifiers are configured to sense and amplify voltages of data from the first global bit lines during the first sensing period and to maintain the amplified voltages of the first global bit lines during the second sensing period. The second sense amplifiers are configured to sense and amplify data from the second global bit lines during the second sensing period. The sensing circuit further includes: first and second equalizers. The first equalizers are configured to precharge the first global bit lines to a precharge voltage after the reading operation. The second equalizers are configured to precharge the second global bit lines to the precharge voltage during the first sensing period and after the reading operation.

According to at least some example embodiments, the semiconductor memory device further includes: first and second column selection circuits. The first column selection circuit is configured to correspondingly connect the first global bit lines to data input/output lines during the second sensing period. The second column selection circuit is configured to correspondingly connect the second global bit lines to the data input/output lines during the second sensing period.

According to at least some example embodiments, the switching circuit respectively connects the first local bit lines to the first global bit lines during a first sub-period of the first sensing period and a third sub-period of the second sensing period, and respectively connects the second local bit lines to the second global bit lines during the second sensing period. The first sense amplifiers are enabled during a second sub-period of the first sensing period and the second sensing period, and sense and amplify data from the first global bit lines. The second sense amplifiers are enabled during the second and third sub-periods of the second sensing period, and sense and amplify data from the second global bit lines.

The first column selection circuit correspondingly connects the first global bit lines to the data input/output lines during the third sub-period of the second sensing period, and the second column selection circuit correspondingly connects the second global bit lines to the data input/output lines during the third sub-period of the second sensing period.

According to at least some example embodiments, the semiconductor memory device further includes: first and second column selection circuits. The first column selection circuit is configured to correspondingly connect the first global bit lines to first data input/output lines during the first sensing period. The second column selection circuit is configured to correspondingly connect the second global bit lines to second data input/output lines during the second sensing period.

According to at least some example embodiments, the switching circuit respectively connects the first local bit lines to the first global bit lines during a first sub-period of the first sensing period and a third sub-period of the second sensing period, and respectively connects the second local bit lines to the second global bit lines during the second sensing period. The first sense amplifiers are enabled during a second sub-period of the first sensing period and the second sensing period, and sense and amplify data from the first global bit lines. The second sense amplifiers are enabled in the second and third sub-periods of the second sensing period, and sense and amplify data from the second global bit lines. The first column selection circuit correspondingly connects the first global bit lines to the first data input/output lines during the third sub-period of the first sensing period, and the second column selection circuit correspondingly connects the second global bit lines to the second data input/output lines during the third sub-period of the second sensing period.

According to at least some example embodiments, the first and second local bit lines are formed of bit-line polycrystalline silicon and the first and second global bit lines are formed of metal.

According to at least some example embodiments, the first and second global bit lines are arranged alternately. The second sensing period may be subsequent to the first sensing period. The first sensing period may include at least two sub-periods, whereas the second sensing period may include at least three sub-periods.

In one example embodiment, the first, second and third sub-periods of the first sensing period may be sequential, and the first, second and third sub-periods of the second sensing period may also be sequential. In another example embodiment, the first and second sub-periods of the first sensing period may be sequential, and the first, second and third sub-periods of the second sensing period may also be sequential.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION

Figure 1:
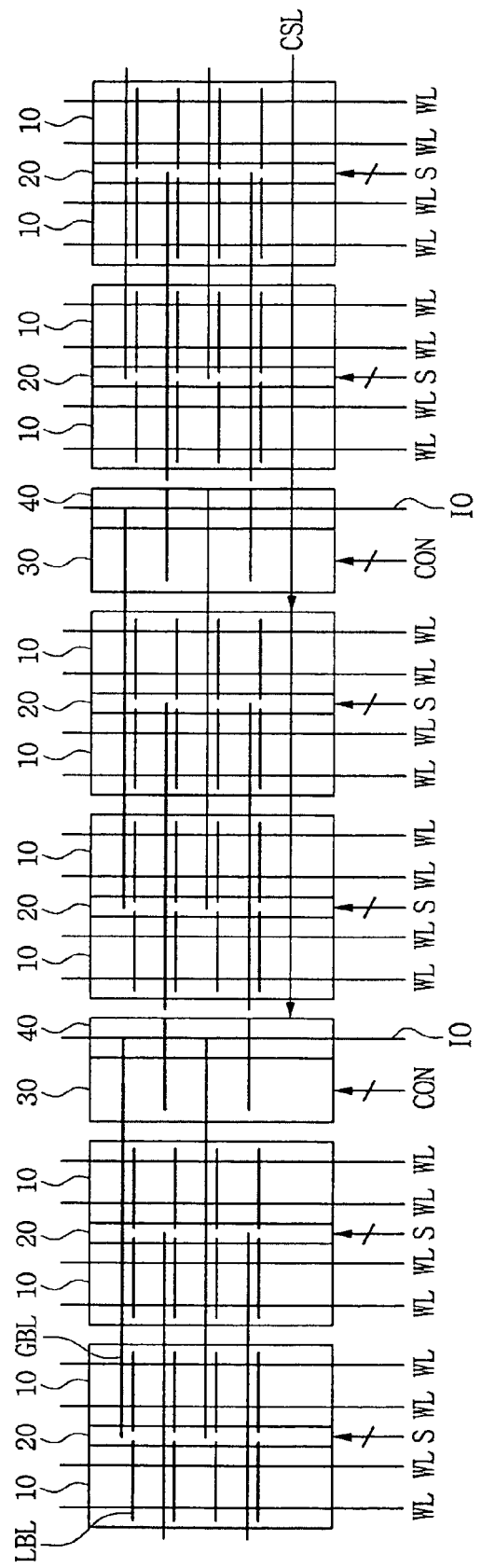
FIG. 1 is a schematic diagram of a semiconductor memory device having a hierarchical bit-line structure in accordance with an example embodiment.

Various example embodiments will now be described more fully with reference to the accompanying drawings in which some example embodiments are shown.

Detailed illustrative embodiments are disclosed herein. However, specific structural and functional details disclosed herein are merely representative for purposes of describing example embodiments. However, embodiments are not limited to those example embodiments shown and described here. Rather, example embodiments may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, embodiments are not limited to only those example embodiments described.

Example embodiments of semiconductor memory devices having hierarchical bit-line structures will be described hereinafter.

FIG. 1 is a schematic diagram of a semiconductor memory device having a hierarchical bit-line structure in accordance with an example embodiment. According to at least this example embodiment, the semiconductor memory device includes a plurality of memory cell array blocks 10, a plurality of switching blocks 20, a plurality of sensing blocks 30, and a plurality of column selection blocks 40. In FIG. 1, WL denotes word lines, LBL denotes local bit lines, GBL denotes global bit lines, IO denotes data input/output lines, S denotes selection signals, CON denotes control signals, and CSL denotes column selection signals. The local bit lines LBL may be made of bit-line polycrystalline silicon and the global bit lines GBL may be formed of metal.

Although example embodiments are discussed herein with regard to "blocks" such as memory cell array blocks 10 and switching blocks 20, the "blocks" may also be referred to as "circuits" or "units."

Referring to FIG. 1, the memory cell array blocks 10 include a plurality of memory cells (not shown) coupled between the local bit lines LBL and the word lines WL. Herein, even ones of the local bit lines LBL are sometimes referred to as first local bit lines, and odd ones of the local bit lines LBL are sometimes referred to as second local bit lines.

In this case, the plurality of memory cells are divided to a plurality of first memory cells and a plurality of second memory cells. The plurality of first memory cells are those memory cells coupled between the first local bit lines and the word lines WL, and the plurality of second memory cells are those memory cells coupled between the second local bit lines and the word lines WL.

The switching blocks 20 connect the local bit lines LBL to the global bit lines GBL in response to the selection signals S to transfer data between the local and global bit lines LBL and GBL. During a reading operation, the switching blocks 20 transfer data in sequence from the local bit lines LBL to the global bit lines GBL adjacent thereto. In one example reading operation, the switching blocks 20 are configured to connect the even members of the local bit lines LBL with the even members of the global bit lines GBL so as to transfer data from the even local bit lines to the even global bit lines. After sensing and amplifying processes of the sensing blocks 30 to the even global bit lines, the switching blocks 20 connect the odd members of the local bit lines LBL with the odd members of the global bit lines GBL to transfer data from the odd local bit lines to the odd global bit lines.

The sensing blocks 30 are configured to sense and amplify data, which are transferred to the global bit lines GBL, in response to the control signals CON (e.g., sensing enable signals, equalizing signals, etc.) applied thereto. The sensing blocks 30 sequentially sense and amplify data from adjacent ones of the global bit lines GBL. In one example, the sensing blocks 30 are configured to sense and amplify data from the even global bit lines after the even local bit lines are connected with the even global bit lines by the switching blocks 20. After the odd local bit lines are connected to the odd global bit lines by the switching blocks 20, the sensing blocks 30 sense and amplify data from the odd global bit lines.

The column selection blocks 40 connect the global bit lines GBL with the data input/output lines IO in response to the column selection signals CSL to transfer data between the global bit lines GBL and the data input/output lines IO.

Figure 2:
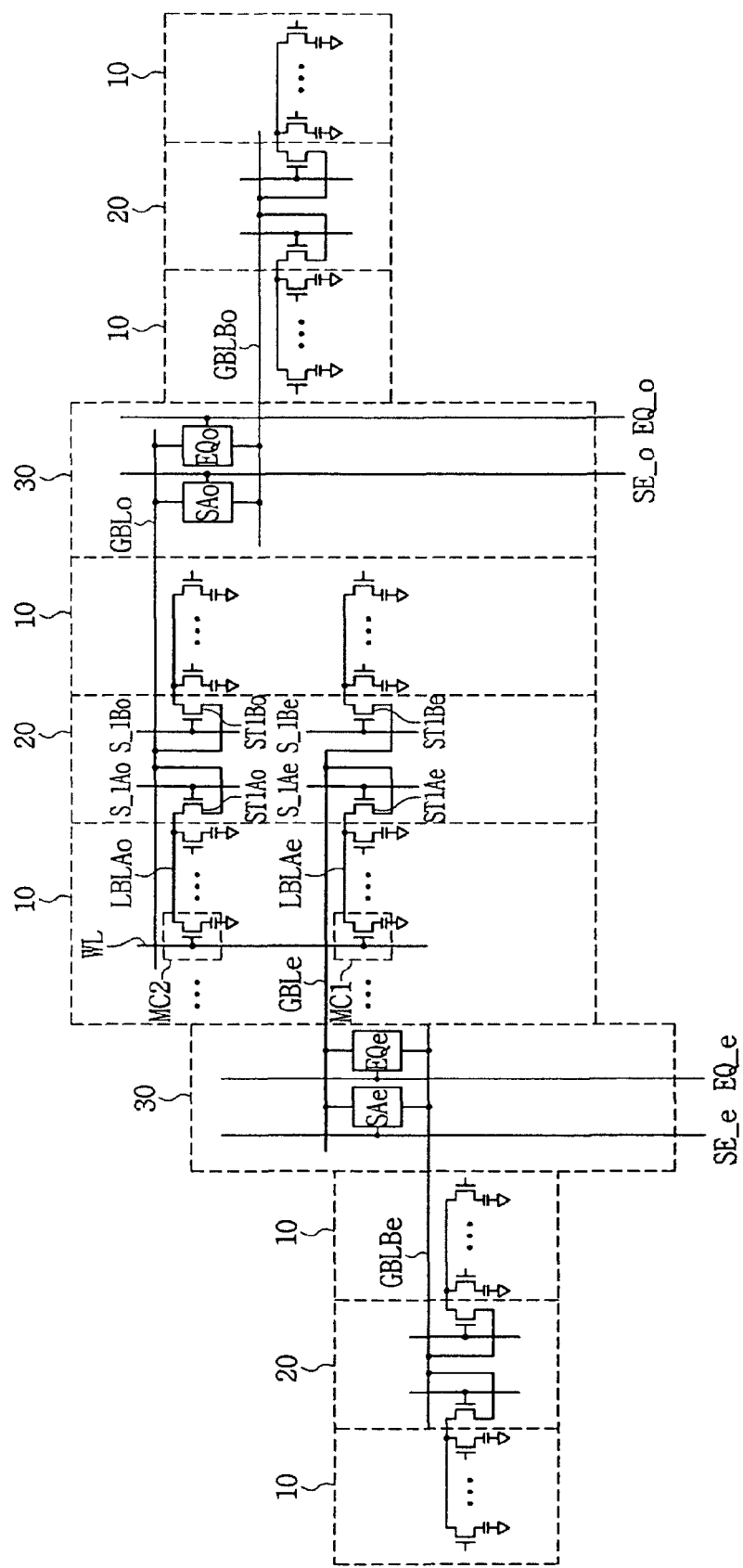
FIG. 2 is a circuit diagram of a memory cell array block, a switching block, and a sensing block of the semiconductor memory device shown in FIG. 1.

FIG. 2 illustrates an example embodiment of the semiconductor memory device of FIG. 1 in further detail. More specifically, FIG. 2 shows example circuit configurations of the memory cell array block 10, the switching block 20, and the sensing block 30 shown in FIG. 1.

In FIG. 2, MC1 denotes a first memory cell, MC2 denotes a second memory cell, SAe denotes a first sense amplifier, EQe denotes a first equalizer, SAo denotes a second sense amplifier, and EQo denotes a second equalizer. WL denotes a word line as a representative of the memory cell array block, LBLAe denotes a first local bit line, LBLAo denotes a second local bit line, GBLe denotes a first global bit line, GBLo denotes a second global bit line, GBLBe denotes a first complementary global bit line, GBLBo denotes a second complementary global bit line, S_1Ae denotes a first selection signal, S_1Ao denotes a second selection signal, SE_e denotes a first sensing enable signal, SE_o denotes a second sensing enable signal, EQ_e denotes a first equalizing signal, and EQ_o denotes a second equalizing signal. The first and second global bit lines GBLe and GBLo are arranged alternately.

The semiconductor memory device shown in FIG. 2 will be described in more detail below with regard to an example reading operation.

Referring to FIG. 2, within the memory cell array block 10, the first memory cell MC1 is connected between word line WL and first local bit lines LBLAe. The second memory cell MC2 is connected between the word line WL and second local bit lines LBLAo. The memory cell array block 10 reads and writes data through charge sharing mechanisms between the first and second local bit lines LBLAe and LBLAo and the first and second memory cells MC1 and MC2. In an example data reading operation, if the word line WL is activated, charge sharing occurs between the first and second local bit lines LBLAe and LBLAo and the memory cells MC coupled to the word line WL.

During the reading operation, the switching block 20 connects the first and second local bit lines LBLAe and LBLAo with the first and second global bit lines GBLe and GBLo in sequence to transfer data between the first and second local bit lines LBLAe and LBLAo and the first and second global bit lines GBLe and GBLo. In more detail, switching transistors ST1Ae, ST1Ao, ST1Be and ST1Bo connected between corresponding local and global bit lines are turned on/off in response to corresponding selection signals S_1Ae, S_1Ao, S_1Be and S_1Bo to transfer data between the local bit lines LBLAe and LBLAo and the global bit lines GBLe and GBLo. Thus, if the selection signals are activated in turn, the local bit lines are sequentially connected to the global bit lines and data are transferred between the local and global bit lines.

For example, after activation of the word line WL, the first selection signal S_1Ae is enabled to turn on the switching transistor ST1Ae. As a result, the first local bit line LBLAe is connected to the first global bit line GBLe to transfer data between the first local bit line LBLAe and the first global bit line GBLe.

The second selection signal S_1Ao is then enabled to turn on the switching transistor ST1Ao. As a result, data are transferred between the second local bit line LBLAo and the second global bit line GBLo.

During this example reading operation, the sensing block 30 senses and amplifies data from the first and second global bit lines GBLe and GBLo in sequence. The sensing block 30 maintains the second global bit line GBLo at a constant or substantially constant voltage level (e.g., a precharge level) while sensing and amplifying data from the first global bit line GBLe. The sensing block 30 also maintains the first global bit line GBLe at a constant or substantially constant voltage level (e.g., a high or low level) while sensing and amplifying data from the second global bit line GBLo.

The first sense amplifier SAe of the sensing block 30 senses and amplifies data from the first global bit line GBLe in response to the first sensing enable signal SE_e. If the first sensing enable signal SE_e is activated, the first sense amplifier SAe senses and amplifies a voltage difference between the first global bit line GBLe and the first complementary global bit line GBLBe in response to the first sensing enable signal SE_e. The second sense amplifier SAo of the sensing block 30 senses and amplifies data from the second global bit line GBLo in response to the second sensing enable signal SE_o. If the second sensing enable signal SE_o is activated, the second sense amplifier SAo senses and amplifies a voltage difference between the second global bit line GBLo and the second complementary global bit line GBLBo in response to the second sensing enable signal SE_o. In this example, the first and second sense amplifiers SAe and SAo are enabled in turn or sequentially.

The first equalizer EQe precharges the first global bit line GBLe to a given, desired or predetermined voltage in response to the first equalizing signal EQ_e. The second equalizer EQo precharges the second global bit line GBLo to a given, desired or predetermined voltage in response to the second equalizing signal EQ_o.

In the example embodiment shown in FIG. 2, operations of restoring the original data into memory cells coupled to an activated word line are designed to proceed at the same or substantially the same time (e.g., simultaneously or concurrently). For example, the first and second selection signals S_1Ae and S_1Ao may all be activated after sensing and amplifying data from the first and second global bit lines GBLe and GBLo through the first and second sense amplifiers SAe and SAo. Thus, data transmission between the first global bit line GBLe and the first local bit line LBLAe, and between the second global bit line GBLo and the second local bit line LBLAo may be performed coincidentally (e.g., simultaneously or concurrently) while the word line WL is activated. Accordingly, restoring data into the memory cells MC coupled to the activated word line WL may be performed coincidentally (e.g., simultaneously or concurrently).

Figure 3:
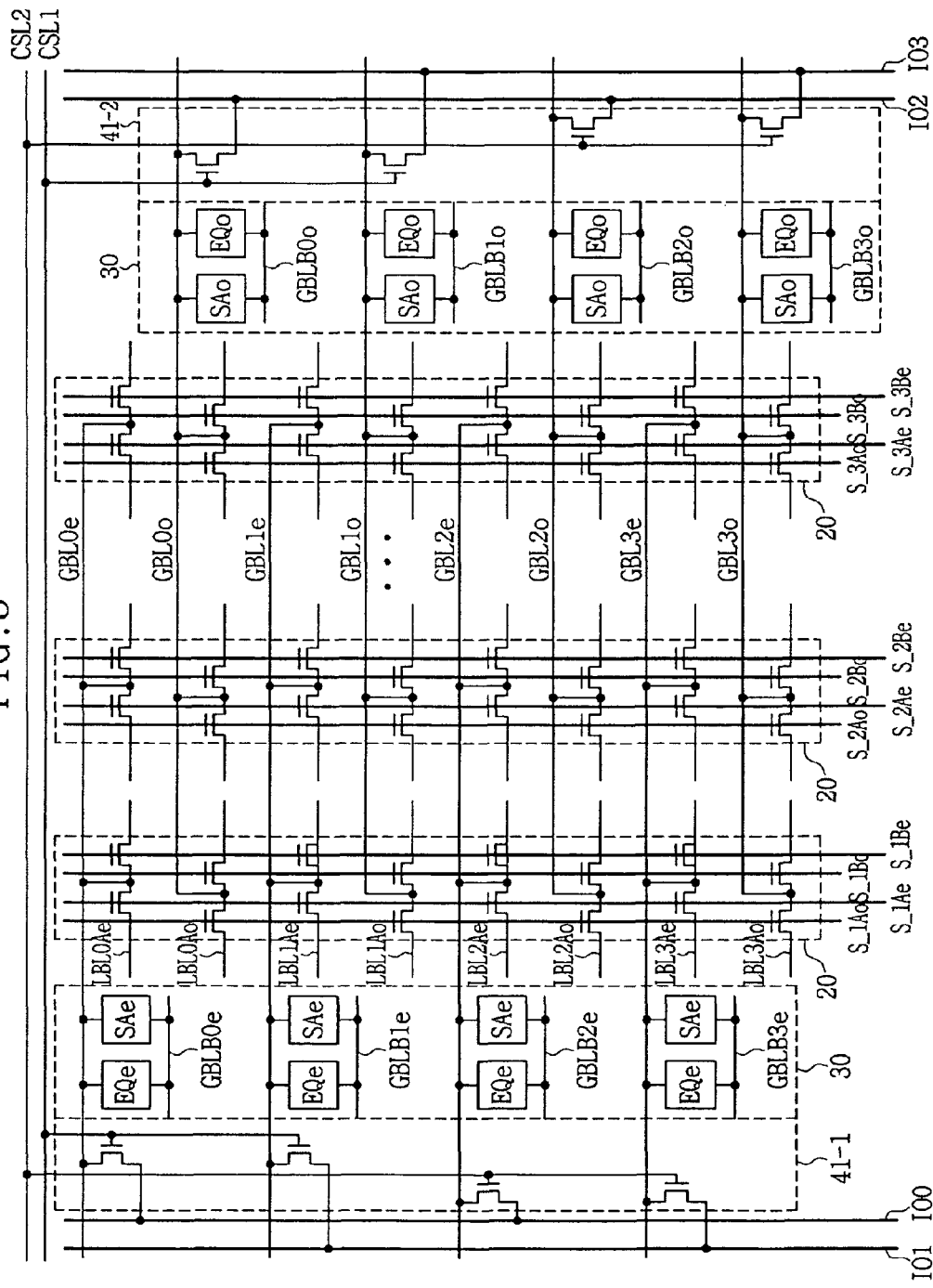
FIG. 3 is a circuit diagram of a semiconductor memory device having a hierarchical bit-line structure in accordance with an example embodiment, showing a switching block, a sensing block, and a column selection block.

FIG. 3 shows another example circuit configuration of a semiconductor memory device having a hierarchical bit-line structure. As shown, FIG. 3 illustrates a switching block 20, a sensing block 30, and column selection blocks 41-1 and 41-2.

Referring to FIG. 3, SAe denotes first sense amplifiers, EQe denotes first equalizers, SAo denotes second sense amplifiers, and EQo denotes second equalizers. LBL0Ae to LBL3Ae denote first local bit lines, LBL0Ao to LBL3Ao denote second local bit lines, GBL0e to GBL3e denote first global bit lines, GBL0o to GBL3o denote second global bit lines, IO0 to IO3 denote data input/output lines, S_1Ae denotes a first selection signal, S_1Ao denotes a second selection signal, CSL1 denotes a first column section signal, and CSL2 denotes a second column selection signal. The first global bit lines GBL0e to GBL3e and the second global bit lines GBL0o to GBL3o are arranged alternately.

Example function or operation of the blocks shown in FIG. 3 will be described in more detail below.

Referring to FIG. 3, the switching block 20, the sensing block 30, the first and second sense amplifiers SAe and SAo of the sensing block 30, and the first and second equalizers EQe and EQo of the sensing block 30 are functionally the same as those discussed above with regard to FIGS. 1 and 2. The first column selection block 41-1 connects the first global bit lines GBL0e and GBL1e to the data input/output lines IO0 and IO1 in response to the first column selection signal CSL1. The first column selection block 41-1 also connects the first global bit lines GBL2e and GBL3e to the data input/output lines IO0 and IO1 in response to the second column selection signal CSL2.

The second column selection block 41-2 connects the second global bit lines GBL0o and GBL1o to the data input/output lines I02 and I03 in response to the first column selection signal CSL1. The second column selection block 41-2 also connects the second global bit lines GBL2o and GBL3o to the data input/output lines IO2 and IO3 in response to the second column selection signal CSL2. The first and second column selection blocks 41-1 and 41-2 connect the first and second global bit lines GBL0e to GBL3e and GBL0o to GBL3o, respectively, to the data input/output lines IO0 to IO3 at the same or substantially the same time (e.g., simultaneously or concurrently) after data sensing and amplifying operations for the first and second global bit lines are complete.

Figure 4:
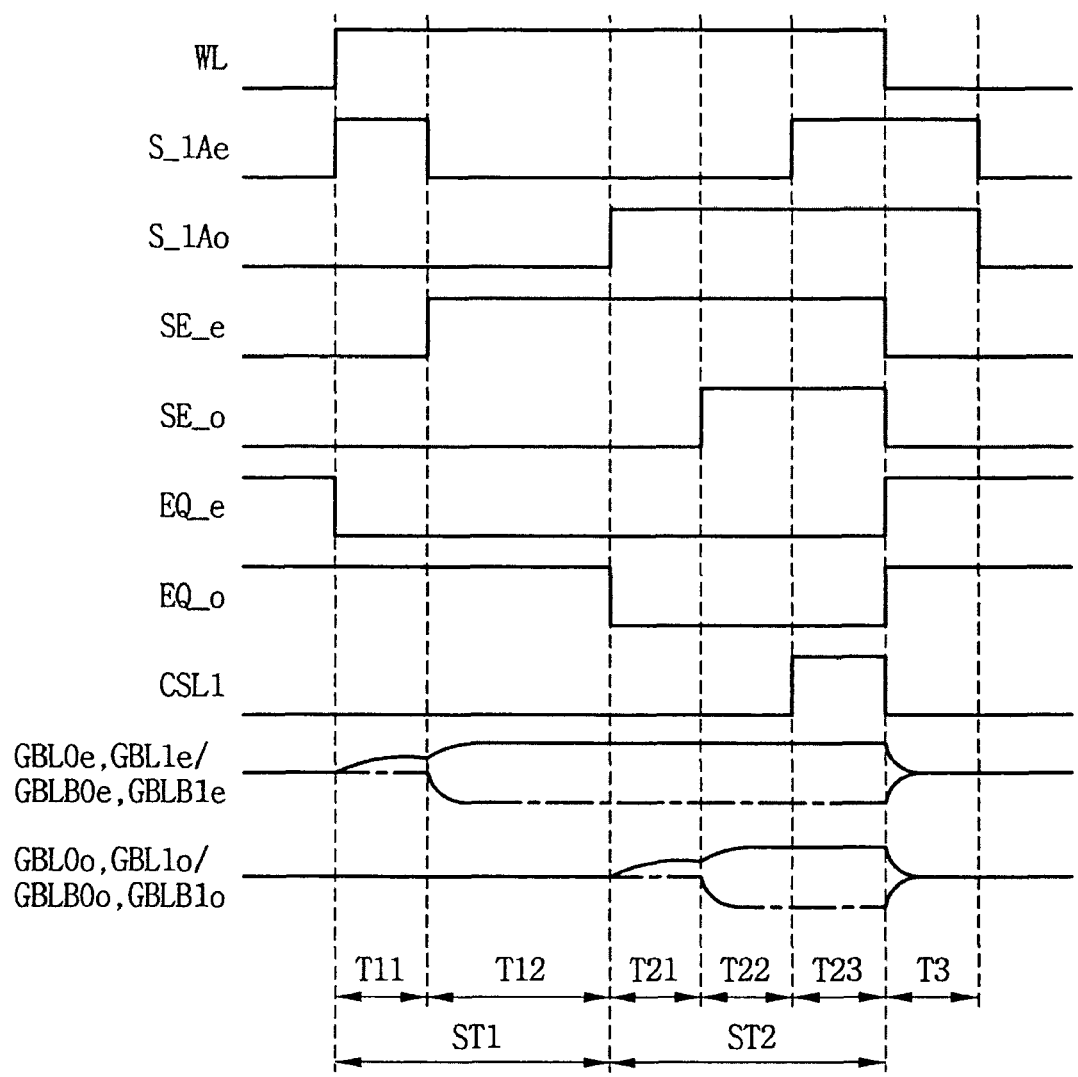
FIG. 4 is a timing diagram illustrating example operation of the semiconductor memory device shown in FIG. 3.

FIG. 4 is a timing diagram illustrating an example operation of the semiconductor memory device shown in FIG. 3. In the timing diagram of FIG. 4, WL denotes a word line as a representative of the memory cell array block, S_1Ae denotes a first selection signal, S_1Ao denotes a second selection signal, SE_e denotes a first sensing enable signal, SE_o denotes a second sensing enable signal, EQ_e denotes a first equalizing signal, EQ_o denotes a second equalizing signal, CSL1 denotes a first column selection line, GBL0e, GBL1e, GBLB0e and GBLB1e denote first global bit lines and first complementary global bit lines, and GBL0o, GBL1o, GBLB0o and GBLB1o denote second global bit lines and second complementary global bit lines.

Referring to FIGS. 3 and 4, an example reading operation of the semiconductor memory device will be described below.

During a first sensing period ST1 of the reading operation, data are transferred from the first local bit lines LBL0Ae to LBL3Ae to the first global bit lines GBL0e to GBL3e, and data of the first global bit lines GBL0e to GBL3e are sensed and amplified. During this period, the second global bit lines GBL0o to GBL3o are maintained at a precharge voltage level.

During a second sensing period ST2 of the reading operation, data are transferred from the second local bit lines LBL0Ae to LBL3Ae to the second global bit lines GBL0o to GBL3o, and data of second global bit lines GBL0o to GBL3o are sensed and amplified. During this period, the first global bit lines GBL0e to GBL3e are maintained at a high or low level. Then, as the first global bit lines GBL0e and GBL1e and the second global bit lines GBL0o and GBL0o are each connected to the data input/output lines IO0 to IO3, data are transferred between the first and second global bit lines GBL0e, GBL1e, GBL0o and GBL1o, and the data input/output lines IO0 to IO3. Afterwards, data restoration for the memory cells coupled to the activated word line WL, the first local bit lines LBL0Ae to LBL3Ae, and the second local bit lines LBL0Ao to LBL3Ao is performed.

An example operation of the first sensing period ST1 will be described in more detail below.

During a first sub-period T11 of the first sensing period ST1, the word line WL is activated, the first selection signal S_1Ae is enabled, and the first equalizing signal EQ_e is disabled. Because the word line WL is activated, charge sharing between the first and second local bit lines LBL0Ae to LBL3Ae and LBL0Ao to LBL3Ao and the memory cells coupled to the word line WL begins. Further, because the first selection signal S_1Ae is activated, the first local bit lines LBL0Ae to LBL3Ae share charge with the first global bit lines GBL0e to GBL3e and data are transferred from the first local bit lines LBL0Ae to LBL3Ae to the first global bit lines GBL0e to GBL3e. Also during the first sub-period T11 of the first sensing period ST1, charge is not shared between the second local bit lines LBL0Ao to LBL3Ao and the second global bit lines GBL0o to GBL3o because the second selection signal S_1Ao is deactivated. Thus, data is not transmitted from the second local bit lines LBL0Ao to LBL3Ao to the second global bit lines GBL0o to GBL3o. Further, the second global bit lines GBL0o to GBL3o are maintained at a given, desired or predetermined precharge voltage level because the second equalizing signal EQ_o is activated.

During a second sub-period T12 of the first sensing period ST1, the first sensing enable signal SE_e is activated. As a result, the first sense amplifiers SAe sense and amplify data from the first global bit lines GBL0e to GBL3e. Then, the first global bit lines GBL0e to GBL3e and the first complementary global bit lines GBLB0e to GBLB3e are charged or discharged to high or low levels. Further, the second sub-period T12 of the first sensing period ST1 proceeds regardless of deactivation of the first selection signal S_1Ae because data has been transmitted between the first local bit lines LBL0Ae to LBL3Ae and the first global bit lines GBL0e to GBL3e in the first sub-period T11 of the first sensing period ST1. During the second sub-period T12 of the first sensing period ST1, the second equalizing signal EQ_o remains activated. Thus, the second global bit lines GBL0o to GBL3o are maintained at a given, desired or predetermined precharge voltage level as in the first sub-period T11 of the first sensing period ST1.

An example operation in the second sensing period ST2 will now be described in more detail below.

During a first sub-period T21 of the second sensing period ST2, the second selection signal S_1Ao is activated, but the second equalizing signal EQ_o is deactivated. Charge sharing occurs between the second local bit lines LBL0Ao to LBL3Ao and the second global bit lines GBL0o to GBL3o, and thus, data are transferred from the second local bit lines LBL0Ao to LBL3Ao to the second global bit lines GBL0o to GBL3o. Also during the first sub-period T21 of the second sensing period ST2, the first global bit lines GBL0e to GBL3e are maintained at high or low levels because those voltages have been amplified during the second sub-period T12 of the first sensing period ST1 and the first sense amplifiers SEe remain activated.

During a second sub-period T22 of the second sensing period ST2, the second sensing enable signal SE_o is activated. As a result, the second sense amplifier SAo senses and amplifies data from the second global bit lines GBL0o to GBL3o. Then, the second global bit lines GBL0o to GBL3o and the second complementary global bit lines GBLB0o to GBLB3o go to high or low levels. Also during the second sub-period T22 of the second sensing period ST2, the first global bit lines GBL0e to GBL3e are maintained at high or low levels as in the first sub-period T21 of the second sensing period ST2.

During a third sub-period T23 of the second sensing period ST2, the first column selection signal CSL1 is activated, and data are transferred from the first global bit lines GBL0e and GBL1e to the data input/output lines IO0 and IO1. Data are also transferred from the second global bit lines GBL0o and GBL0o to the data input/output lines 102 and 103. Further, because the first and second selection signals S_1Ae and S_1Ao are all activated, the original data are restored into the memory cells coupled to the activated word line WL by returning data from the first global bit lines GBL0e and GBL3e to the first local bit lines LBL0Ae to LBL3Ae and returning data from the second global bit lines GBL0o and GBL3o to the second local bit lines LBL0Ao to LBL3Ao.

During a third period T3, after the first and second sensing periods ST1 and ST2, the word line WL, the first sensing enable signal SE_e, and the second sensing enable signal SE_o are deactivated, whereas the first equalizing signal EQ_e and the second equalizing signal EQ_o are activated. The first global bit lines GBL0e to GBL3e, the first complementary global bit lines GBLB0e to GBLB3e, the second global bit lines GBL0o to GBL3o, the second complementary global bit lines GBLB0o to GBLB3o are set to a given, desired or predetermined voltage level.

According to at least the example embodiment of the semiconductor memory device having a hierarchical bit-line structure shown in FIGS. 3 and 4, a reading operation is executed by: transferring data to the first global bit lines GBL0e to GBL3e; sensing and amplifying data from the first global bit lines GBL0e to GBL3e; transferring data to the second global bit lines GBL0o to GBL3o adjacent to the first global bit lines GBL0e to GBL3e; sensing and amplifying data from the second global bit lines GBL0o to GBL3o; and outputting the data from the first and second global bit lines GBL0e to GBL1e and GBL0o to GBL1o to the input/output lines IO0 to IO3.

Figure 5:
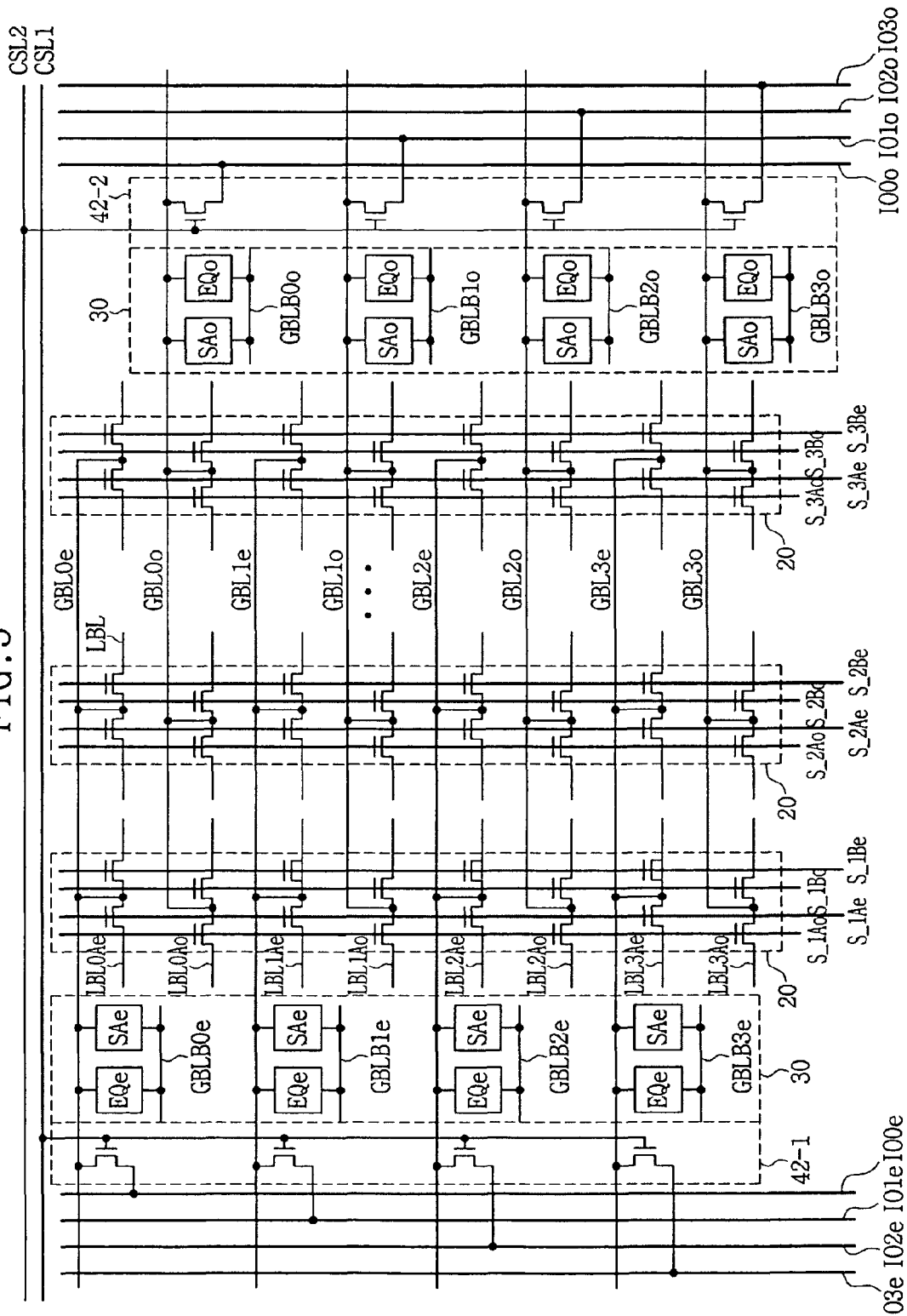
FIG. 5 is a circuit diagram of a semiconductor memory device having a hierarchical bit-line structure in accordance with another example embodiment, showing a switching block, a sensing block, and a column selection block.

FIG. 5 shows another example embodiment of a semiconductor memory device having a hierarchical bit-line structure. As shown, FIG. 5 illustrates a switching block 20, a sensing block 30, and column selection blocks 42-1 and 42-2 in an example circuit configuration.

In FIG. 5, SAe denotes first sense amplifiers, EQe denotes first equalizers, SAo denotes second sense amplifiers, and EQo denotes second equalizers. LBL0Ae to LBL3Ae denote first local bit lines, LBL0Ao to LBL3Ao denote second local bit lines, GBL0e to GBL3e denote first global bit lines, GBL0o to GBL3o denote second global bit lines, IO0e to IO3e denote first data input/output lines, IO0o to IO3o denote second data input/output lines, S_1Ae denotes a first selection signal, S_1Ao denotes a second selection signal, CSL1 denotes a first column section signal, and CSL2 denotes a second column selection signal.

Example functions of the blocks shown in FIG. 5 will be described in more detail below.

The switching block 20, the sensing block 30, the first and second sense amplifiers SAe and SAo of the sensing block 30, and the first and second equalizers EQe and EQo of the sensing block 30 are functionally the same as those described above with reference to FIGS. 1 and 2.

Referring to FIG. 5, the first column selection block 42-1 connects the first global bit lines GBL0e to GBL3e to the first data input/output lines IO0e to IO3e in response to the first column selection signal CSL1. The second column selection block 42-2 connects the second global bit lines GBL2o to GBL3o to the second data input/output lines IO0o to IO3o in response to the second column selection signal CSL2. The first and second column selection blocks 42-1 and 42-2 correspondingly connect the global bit lines GBL0e to GBL3e and GBL0o to GBL3o to the data input/output lines IO0e to IO3e and IO0o to IO3o in sequence. For example, the first column selection block 42-1 connects the first global bit lines GBL0e to GBL3e to the first data input/output lines IO0e to IO3e after completing data sensing and amplifying operations for the first global bit lines GBL0e to GBL3e. The second column selection block 42-2 connects the second global bit lines GBL0o to GBL3o to the second data input/output lines IO0o to IO3o after completing data sensing and amplifying operations for the second global bit lines GBL0o to GBL3o.

Figure 6:
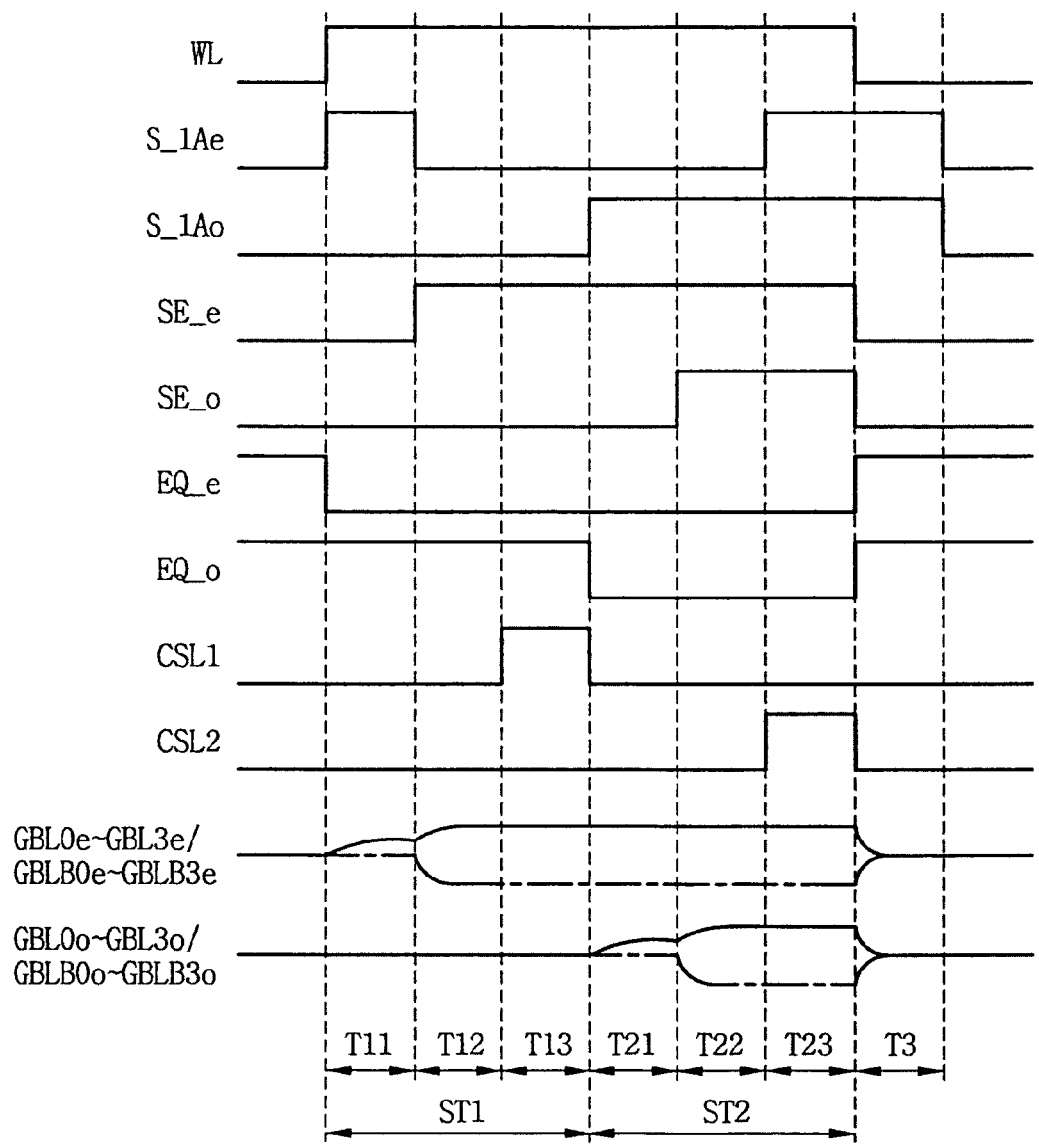
FIG. 6 is a timing diagram illustrating example operation of the semiconductor memory device shown in FIG. 5.

FIG. 6 shows an example timing diagram for the semiconductor memory device shown in FIG. 5. In FIG. 6, WL denotes a word line as a representative of the memory cell array block, S_1Ae denotes a first selection signal, S_1Ao denotes a second selection signal, SE_e denotes a first sensing enable signal, SE_o denotes a second sensing enable signal, EQ_e denotes a first equalizing signal, EQ_o denotes a second equalizing signal, CSL1 denotes a first column selection line, CSL2 denotes a second column selection line, GBL0e to GBL3e and GBLB0e to GBLB3e denote first global bit lines and first complementary global bit lines, and GBL0o to GBL3o and GBLB0o to GBLB3o denote second global bit lines and second complementary global bit lines.

Referring to FIGS. 5 and 6, during a first sensing period ST1 of a reading operation, data are transferred from the first local bit lines LBL0Ae to LBL3Ae to the first global bit lines GBL0e to GBL3e, and data of the first global bit lines GBL0e to GBL3e are sensed and amplified. In addition, the amplified data are transferred from the first global bit lines GBL0e to GBL3e to the first data input/output lines IO0e to IO3e. Also during the first sensing period ST1, the second global bit lines GBL0o to GBL3o are maintained at a constant or substantially constant voltage level (e.g., a precharge voltage level).

During a second sensing period ST1 of the reading operation, data are transferred from the second local bit lines LBL0Ao to LBL3Ao to the second global bit lines GBL0o to GBL3o, and data of the second global bit lines GBL0o to GBL3o are sensed and amplified. The amplified data are transferred from the second global bit lines GBL0o to GBL3o to the second data input/output lines IO0o to IO3o. Also during the second sensing period ST2, the first global bit lines GBL0e to GBL3e are maintained at a constant or substantially constant level (e.g., a high or low level). Afterwards, data restoration for the memory cells coupled to the activated word line WL, the first local bit lines LBL0Ae to LBL3Ae, and the second local bit lines LBL0Ao to LBL3Ao is performed in process.

An operation of the first sensing period ST1 will be described in more detail below.

A first sub-period T11 of the first sensing period ST1 is the same or substantially the same as that described above with reference to FIG. 4. Because the word line WL is activated, charge sharing begins between the first and second local bit lines LBL0Ae to LBL3Ae and LBL0Ao to LBL3Ao and the memory cells coupled to the word line WL. And, data are transferred from the first local bit lines LBL0Ae to LBL3Ae to the first global bit lines GBL0e to GBL3e. Also during this sub-period, the second equalizing signal EQ_o is activated, and thus, the second global bit lines GBL0o to GBL3o are maintained at a given, desired or predetermined precharge voltage level.

A second sub-period T12 of the first sensing period ST1 is the same or substantially the same as that discussed above with reference to FIG. 4. The first sense amplifiers SAe are enabled to sense and amplify data from the first global bit lines GBL0e to GBL3e. Then, the first global bit lines GBL0e to GBL3e and the first complementary global bit lines GBLB0e to GBLB3e are charged or discharged to high or low levels. Also during the second sub-period T12 of the first sensing period ST1, the second global bit lines GBL0o to GBL3o are maintained at a given, desired or predetermined precharge voltage level as in the first sub-period T11 of the first sensing period ST1.

During a third sub-period T13 of the first sensing period ST1, the first column selection signal CSL1 is activated and data are correspondingly transferred from the first global bit lines GBL0e to GBL3e to the first data input/output lines IO0e to IO3e.

An example operation during the second sensing period ST2 will be described in more detail below.

A first sub-period T21 of the second sensing period ST2 is the same or substantially the same as that described above with reference to FIG. 4. During the first sub-period T21, the second selection signal S_1Ao is activated, whereas the second equalizing signal EQ_o is deactivated. Then, data are transferred from the second local bit lines LBL0Ao to LBL3Ao to the second global bit lines GBL0o to GBL3o. Also during the first sub-period T21 of the second sensing period ST2, the first global bit lines GBL0e to GBL3e are maintained at high or low levels because those voltages have been amplified during the second term T12 of the first sensing period ST1 and the first sense amplifiers SEe remain activated.

A second sub-period T22 of the second sensing period ST2 is also the same or substantially the same as that discussed above with reference to FIG. 4. The second sensing enable signal SE_o is activated, and thus, the second sense amplifier SAo senses and amplifies data from the second global bit lines GBL0o to GBL3o. Then, the second global bit lines GBL0o to GBL3o and the second complementary global bit lines GBLB0o to GBLB3o go to high or low levels. Also during the second sub-period T22 of the second sensing period ST2, the first global bit lines GBL0e to GBL3e are maintained at high or low levels as in the first sub-period T21 of the second sensing period ST2.

During a third sub-period T23 of the second sensing period ST2, the second column selection signal CSL2 is activated, and data are correspondingly transferred from the second global bit lines GBL0o to GBL3o to the second data input/output lines IO0o to IO3o. Further, because the first and second selection signals S_1Ae and S_1Ao are all activated, the original data are restored into the memory cells coupled to the activated word line WL by returning data from the first global bit lines GBL0e to GBL3e to the first local bit lines LBL0Ae to LBL3Ae and returning data from the second global bit lines GBL0o to GBL3o to the second local bit lines LBL0Ao to LBL3Ao.

During a third period T3, after the first and second sensing periods ST1 and ST2, the word line WL, the first sensing enable signal SE_e, and the second sensing enable signal SE_o are deactivated, whereas the first equalizing signal EQ_e and the second equalizing signal EQ_o are activated. Then, the first global bit lines GBL0e to GBL3e, the first complementary global bit lines GBLB0e to GBLB3e, the second global bit lines GBL0o to GBL3o, and the second complementary global bit lines GBLB0o to GBLB3o are set to a given, desired or predetermined voltage level.

According to at least the example embodiment shown in FIGS. 5 and 6, the reading operation is executed by: transferring data to the first global bit lines GBL0e to GBL3e; sensing and amplifying data from the first global bit lines GBL0e to GBL3e; outputting data from the first global bit lines GBL0e to GBL3e to the first data input/output lines IO0e to IO3e; transferring data to the second global bit lines GBL0o to GBL3o adjacent to the first global bit lines GBL0e to GBL3e; sensing and amplifying data from the second global bit lines GBL0o to GBL3o; and outputting data from the second global bit lines GBL0o to GBL3o to the second input/output lines IO0o to IO3o.

While example embodiments of semiconductor memory devices having hierarchical bit-line structures are described in example configurations relevant to dynamic random access memory cells (DRAM) each formed of a cell transistor and a cell capacitor, example embodiments may also be applied to other kinds of memories including, but not limited to: phase-change RAMs, magnetic RAMs, and so on.

As described above, semiconductor memory devices having hierarchical bit-line structures according to example embodiments are more effective in reducing noise by coupling capacitance between adjacent global bit lines, for which data are transferred to the adjacent global bit lines, and sensed and amplified from the adjacent global bit lines in sequence. This may enlarge a voltage difference between the adjacent global bit lines during a reading operation, thereby improving operating characteristics of semiconductor memory devices.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
    a memory cell array including,
        a plurality of first memory cells connected between word lines and first local bit lines, and
        a plurality of second memory cells connected between the word lines and second local bit lines;
    a switching circuit configured to respectively connect the first local bit lines to first global bit lines during a first sensing period of a reading operation, and to respectively connect the second local bit lines to second global bit lines during a second sensing period of the reading operation; and
    a sensing circuit configured to sense and amplify data from the first global bit lines during the first sensing period of the reading operation, and configured to sense and amplify data from the second global bit lines during the second sensing period of the reading operation.

2. The semiconductor memory device according to claim 1, wherein the sensing circuit is further configured to maintain the second global bit lines at a constant voltage level during the first sensing period, and to maintain the first global bit lines at a constant voltage level during the second sensing period.

3. The semiconductor memory device of claim 2, wherein the second sensing period is subsequent to the first sensing period of the reading operation.

4. The semiconductor memory device according to claim 2, wherein the sensing circuit comprises:
    a plurality of first sense amplifiers configured to sense and amplify voltages of data from the first global bit lines during the first sensing period, and to maintain the amplified voltages of the first global bit lines during the second sensing period;
    a plurality of second sense amplifiers configured to sense and amplify data from the second global bit lines during the second sensing period;
    a plurality of first equalizers configured to precharge the first global bit lines to a precharge voltage after the reading operation; and
    a plurality of second equalizers configured to precharge the second global bit lines to the precharge voltage during the first sensing period and after the reading operation.

5. The semiconductor memory device according to claim 4, further comprising:
    a first column selection circuit configured to correspondingly connect the first global bit lines to data input/output lines during the second sensing period; and
    a second column selection circuit configured to correspondingly connect the second global bit lines to the data input/output lines during the second sensing period.

6. The semiconductor memory device according to claim 5, wherein the switching circuit respectively connects the first local bit lines to the first global bit lines during a first sub-period of the first sensing period and a third sub-period of the second sensing period, and the switching circuit respectively connects the second local bit lines to the second global bit lines during the second sensing period.

7. The semiconductor memory device of claim 6, wherein
    the first sense amplifiers sense and amplify data from the first global bit lines during a second sub-period of the first sensing period and the second sensing period,
    the second sense amplifiers sense and amplify data from the second global bit lines during the second sub-period and a third sub-period of the second sensing period,
    the first column selection circuit correspondingly connects the first global bit lines to the data input/output lines during the third sub-period of the second sensing period, and
    the second column selection circuit correspondingly connects the second global bit lines to the data input/output lines during the third sub-period of the second sensing period.

8. The semiconductor memory device according to claim 4, further comprising:
    a first column selection circuit configured to correspondingly connect the first global bit lines to first data input/output lines during the first sensing period; and
    a second column selection circuit configured to correspondingly connect the second global bit lines to second data input/output lines during the second sensing period.

9. The semiconductor memory device according to claim 8, wherein the switching circuit respectively connects the first local bit lines to the first global bit lines during a first sub-period of the first sensing period and a third sub-period of the second sensing period, and respectively connects the second local bit lines to the second global bit lines during the second sensing period.

10. The semiconductor memory device according to claim 9, wherein
    the first sense amplifiers sense and amplify data from the first global bit lines during a second sub-period of the first sensing period and the second sensing period,
    the second sense amplifiers sense and amplify data from the second global bit lines during the second sub-period and a third sub-period of the second sensing period,
    the first column selection circuit correspondingly connects the first global bit lines to the first data input/output lines during the third sub-period of the first sensing period, and
    the second column selection circuit correspondingly connects the second global bit lines to the second data input/output lines during the third sub-period of the second sensing period.

11. The semiconductor memory device according to claim 2, wherein the first sensing period includes at least three sequential sub-periods and the second sensing period includes at least three sequential sub-periods, and wherein the switching circuit respectively connects the first local bit lines to the first global bit lines during a first sub-period of the first sensing period and a third sub-period of the second sensing period, and respectively connects the second local bit lines to the second global bit lines during the second sensing period.

12. The semiconductor memory device according to claim 11, wherein the sensing circuit comprises:
    a plurality of first sense amplifiers configured to sense and amplify data from the first global bit lines during a second sub-period of the first sensing period and the second sensing period; and
    a plurality of second sense amplifiers configured to sense and amplify data from the second global bit lines during the second sub-period and the third sub-period of the second sensing period.

13. The semiconductor memory device according to claim 12, further comprising:
    a first column selection circuit configured to correspondingly connect the first global bit lines to first data input/output lines during the third sub-period of the first sensing period; and a second column selection circuit configured to correspondingly connect the second global bit lines to second data input/output lines during the third sub-period of the second sensing period.

14. The semiconductor memory device according to claim 2, wherein the first sensing period includes at least two sequential sub-periods and the second sensing period includes at least three sequential sub-periods, and wherein the switching circuit is configured to respectively connect the first local bit lines to the first global bit lines during a first sub-period of the first sensing period and a third sub-period of the second sensing period, and to respectively connect the second local bit lines to the second global bit lines during the second sensing period.

15. The semiconductor memory device of claim 14, wherein the sensing circuit comprises:
   a plurality of first sense amplifiers configured to sense and amplify data from the first global bit lines during a second sub-period of the first sensing period and the second sensing period; and
   a plurality of second sense amplifiers configured to sense and amplify data from the second global bit lines during the second sub-period and the third sub-period of the second sensing period.

16. The semiconductor memory device according to claim 15, further comprising:
   a first column selection circuit configured to correspondingly connect the first global bit lines to data input/output lines during the third sub-period of the second sensing period; and
   a second column selection circuit configured to correspondingly connect the second global bit lines to data input/output lines during the third sub-period of the second sensing period.

17. The semiconductor memory device according to claim 1, wherein the first and second local bit lines are formed of bit-line polycrystalline silicon and the first and second global bit lines are formed of metal.

18. The semiconductor memory device according to claim 1, wherein the first and second global bit lines are arranged alternately.

19. The semiconductor memory device of claim 1, wherein the second sensing period is subsequent to the first sensing period of the reading operation.

* * * * *